(12) United States Patent
Brain et al.

(10) Patent No.: US 9,780,038 B2
(45) Date of Patent: Oct. 3, 2017

(54) AVD HARDMASK FOR DAMASCENE PATTERNING

(71) Applicant: Intel Corporation, Santa Clara, CA (US)

(72) Inventors: Ruth A. Brain, Portland, OR (US);
Kevin J. Fischer, Hillsboro, OR (US);
Michael A. Childs, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/332,199

(22) Filed: Oct. 24, 2016

(65) Prior Publication Data

US 2017/0040263 A1    Feb. 9, 2017

Related U.S. Application Data

(63) Continuation of application No. 13/995,133, filed as application No. PCT/US2011/067764 on Dec. 29, 2011, now Pat. No. 9,502,281.

(51) Int. Cl.

| | |
|---|---|
| *H01L 23/00* | (2006.01) |
| *H01L 23/532* | (2006.01) |
| *H01L 21/768* | (2006.01) |
| *H01L 23/498* | (2006.01) |
| *H01L 23/522* | (2006.01) |

(Continued)

(52) U.S. Cl.
CPC .... *H01L 23/5329* (2013.01); *H01L 21/31144* (2013.01); *H01L 21/76802* (2013.01); *H01L 21/76807* (2013.01); *H01L 23/49827* (2013.01); *H01L 23/528* (2013.01); *H01L 23/5226* (2013.01); *H01L 21/311* (2013.01); *H01L 2924/0002* (2013.01)

(58) Field of Classification Search
CPC .................................................. H01L 23/5329
See application file for complete search history.

(56) References Cited

U.S. PATENT DOCUMENTS

| | | | |
|---|---|---|---|
| 2002/0081854 A1* | 6/2002 | Morrow | ............ H01L 21/31144 438/694 |
| 2004/0198062 A1 | 10/2004 | Ye et al. | |
| 2006/0091559 A1 | 5/2006 | Nguyen et al. | |

(Continued)

OTHER PUBLICATIONS

Intel Corporation, Office Action dated Apr. 24, 205 for TW Application No. 101148340.

(Continued)

*Primary Examiner* — William Harriston
(74) *Attorney, Agent, or Firm* — Schwabe, Williamson & Wyatt P.C.

(57) ABSTRACT

A method including forming a dielectric layer on a contact point of an integrated circuit structure; forming a hardmask including a dielectric material on a surface of the dielectric layer; and forming at least one via in the dielectric layer to the contact point using the hardmask as a pattern. An apparatus including a circuit substrate including at least one active layer including a contact point; a dielectric layer on the at least one active layer; a hardmask including a dielectric material having a least one opening therein for an interconnect material; and an interconnect material in the at least one opening of the hardmask and through the dielectric layer to the contact point.

12 Claims, 4 Drawing Sheets

(51) Int. Cl.
*H01L 23/528* (2006.01)
*H01L 21/311* (2006.01)

(56) References Cited

U.S. PATENT DOCUMENTS

2007/0224795 A1\* 9/2007 Chen ................ H01L 21/76807
   438/597
2008/0277789 A1 11/2008 Liu et al.
2010/0181682 A1 7/2010 Arai

OTHER PUBLICATIONS

Intel Corporation, International Preliminary Report on Patentability dated Jul. 10, 2014 for PCT/US2011/067764.
Intel Corporation, Non final office action dated May 21, 2014 for U.S. Appl. No. 13/995,133.
Intel Corporation, PCT Search Report mailed Oct. 29, 2012 for International Application No. PCT/US/2011/067764.
Intel Corporation, Final Office Action dated Oct. 20, 2014 for U.S. Appl. No. 13/995,133.

\* cited by examiner

AVD HARDMASK FOR DAMASCENE PATTERNING

CROSS-REFERENCE TO RELATED APPLICATION

This patent application is a continuation of U.S. application Ser. No. 13/995,133, filed Jun. 17, 2013, which is a U.S. National Phase Application under 35 U.S.C. §371 of International Application No. PCT/US2011/067764, filed Dec. 29, 2011, entitled AVD HARDMASK FOR DAMASCENE PATTERNING.

BACKGROUND

Field

Integrated circuit processing.

Description of Related Art

Modern integrated circuits use conductive interconnections to connect the individual devices on a chip and/or to send and/or receive signals external to the device(s). Common types of interconnections include copper and copper alloy interconnections (lines) coupled to individual devices, including other interconnections (lines) by interconnections through vias. It is not uncommon for integrated circuit to have multiple levels of interconnections (e.g., five or six levels) separated by dielectric materials. In prior integrated circuit structures, a popular dielectric material for use as an interlayer dielectric (ILD) was silicon dioxide ($SiO_2$). Currently, efforts are focused on minimizing the effective dielectric constant of an ILD so materials having a dielectric constant lower than $SiO_2$ (low k dielectric material) have garnered significant consideration. Many of these materials, such as carbon, silicon, oxygen based materials are porous.

Developing and implementing low k ILD based integrated circuits may utilize complementary and compatible photolithography and etching processes to pattern devices that will not attack underlying layers critical to device performance. Representatively, contacts made out of tungsten are used, for example, as vertical interconnects between the source/drain junction of transistor devices and the first level interconnect, which typically consists of a dual damascene metal and a via used to connect to the contact layer in multilevel interconnect schemes. Current post patterning cleaning schemes as applied to a first dual damascene metal layer (M1/V0) deposited on a contact have a generally narrow process window due to the requirements of being able to remove both the metal hard mask (e.g., titanium or titanium nitride), photoresist, and residual etch polymer while simultaneously not etching tungsten (in the contact exposed thru the V0), copper or the low k ILD.

One process to form a first dual damascene metal level (M1) on an integrated circuit structure uses a titanium nitride hard mask to create a dual damascene M1V0 about a tungsten plug. The titanium nitride hard mask is conductive and therefore must be removed to avoid line-to-line shorting. Wet clean chemistries have not been identified that can strip titanium nitride without also damaging the tungsten contact layer. To address this issue, one solution is that after the W1V0 patterning and prior to titanium nitride removal, a sacrificial light absorbing material (SLAM) is deposited and dry etched for use as a layer to protect the underlying tungsten during the titanium nitride wet clean. This method can be costly and tends to increase the M1V0 critical dimensions due to multiple process steps which can lead to V0 to wrong contact shorting.

DETAILED DESCRIPTION

Figure 1:
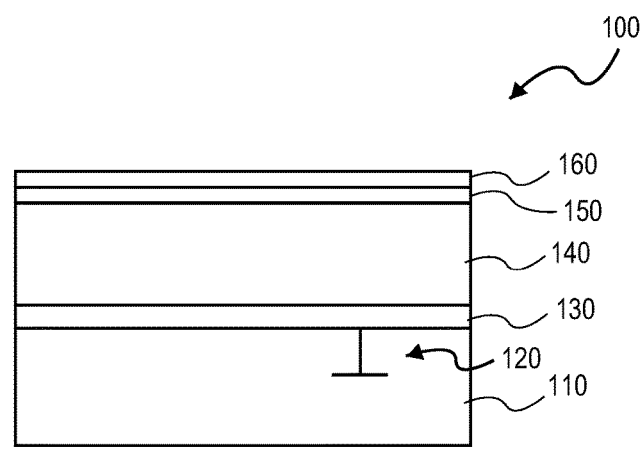
FIG. 1 shows a schematic cross-sectional side view of a portion of a circuit structure including a contact point, an etch stop layer over the contact point followed by an interlayer dielectric (ILD) and two hard masks.

FIG. 1 shows a cross-sectional side view of a portion of an integrated circuit structure, such as a portion of a microprocessor chip on a silicon die at a point in the process of forming interconnection to a device, including possibly to other interconnections. A typical integrated circuit structure such as a microprocessor chip may have, for example, multiple interconnection layers or levels separated from one another by interlayer dielectric (ILD) material. Referring to FIG. 1, structure 100 includes substrate 110 which may be the wafer substrate (e.g., a portion of a silicon wafer) having circuit devices, including transistors, thereon as well as one or more levels of interconnection to devices. FIG. 1 shows contact point 120 that may be a circuit device formed in or on a substrate (e.g., a silicon substrate) or an interconnection line formed above the wafer to devices on the wafer. It is appreciated that the techniques described herein may be used for various interconnections within an integrated circuit including to devices that include circuit devices and other interconnections. In this sense, contact point 120 represents such devices or interconnections where an interconnection contact may be made.

Overlying substrate 110 in FIG. 1 is etch stop layer 130 of a material such as silicon nitride ($Si_xN_y$) or silicon carbon nitride (SiCN). Overlying etch stop layer 130 is dielectric layer 140 which is, for example, an ILD. A representative material for dielectric layer 140 is a material having, for example, a dielectric constant (k) less than the dielectric constant of silicon dioxide ($SiO_2$) (e.g., a "low k" material). Representative low k material includes materials containing silicon, carbon and oxygen which may be referred to as polymers and that are known in the art. In one embodiment, dielectric layer 140 is porous.

Overlying dielectric layer 140 in FIG. 1 is first hard mask 150. In one embodiment, first hard mask 150 is a dielectric material. Suitable dielectric materials for hard mask 150 include materials having, for example, a dielectric constant (k) greater than a dielectric constant of $SiO_2$ (e.g., a "high k"

material). Suitable materials are also those materials that have a density greater than a material for dielectric material 140 and have a etch selectivity relative to a material for dielectric layer 140 (e.g., can be etched at a different rate than or exclusive of a material for dielectric layer 140). Representative materials include silicon oxynitride, hafnium oxide, zirconium oxide, hafnium silicate, hafnium oxynitride, lanthanum oxide, aluminum oxide and similar high dielectric constant materials. In one embodiment, hard mask 150 is deposited, for example, by a plasma deposition process, to a thickness to serve as a mask to underlying dielectric layer 140 (e.g., to protect from undesired modification of the dielectric material from energy used in subsequent mask registration). In one embodiment, a representative thickness is a thickness that will not significantly effect an overall dielectric constant of the ILD (dielectric layer plus hard mask 150) but at most will marginally effect such overall dielectric constant. In one embodiment, a representative thickness is on the order of 30 angstroms (Å)±20 Å. In another embodiment, a representative thickness is on the order of two to five nanometers (nm).

Overlying hard mask 150 in structure 100 of FIG. 1 is optional hard mask 160. Hard mask 160, in one embodiment, is a conductive material such as silicon nitride, titanium nitride or titanium. It is appreciated that, as it is optional, second hard mask 160 need not be present. If present, a representative thickness of second hard mask 160 is on the order of 20 nanometers.

Figure 2:
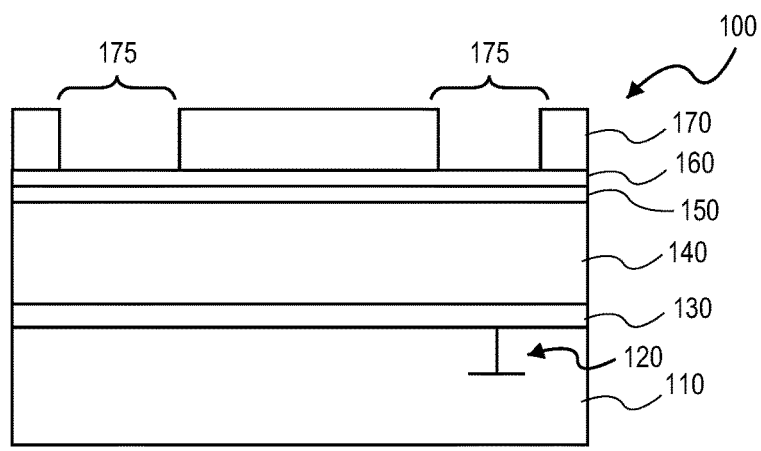
FIG. 2 shows a structure of FIG. 1 with the introduction of a photoresist material to trench pattern the hard masks.

FIG. 2 shows the structure of FIG. 1 following the deposition and patterning of photoresist material 170. In this embodiment, photoresist 170 is patterned to define opening 175 over second hard mask 160 to allow patterning of hard mask 160 and hard mask 150 for exposure to dielectric layer 140 for a trench opening.

Figure 3:
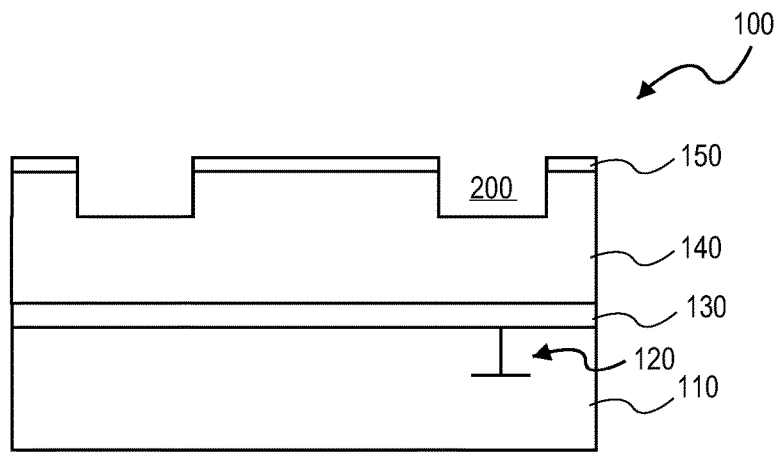
FIG. 3 shows the structure of FIG. 2 following the formation of trenches and the removal of the photoresist material and the optional removal of one hard mask.

FIG. 3 shows the structure of FIG. 2 following the opening of trenches through dielectric layer 140 and the removal of photoresist material 170. FIG. 3 also shows structure 100 following the removal of optional hard mask 160. In one embodiment, a hard mask of silicon nitride may be removed with a wet clean chemistry.

Figure 4:
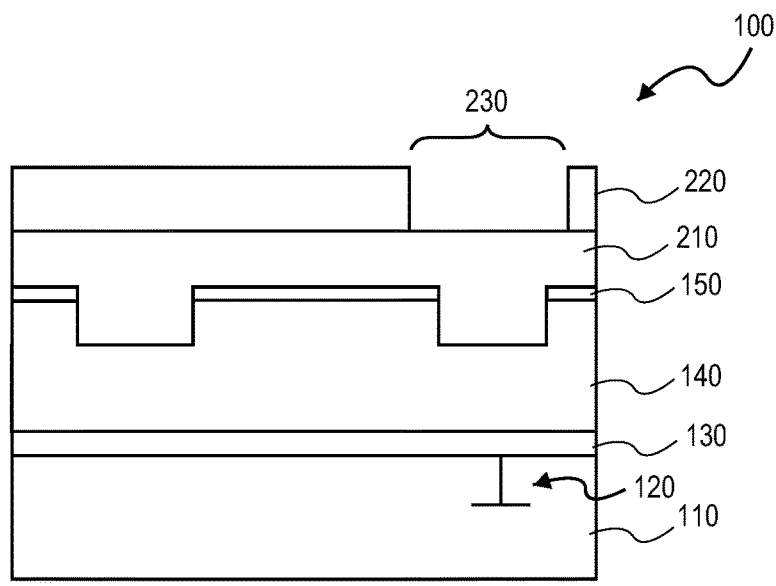
FIG. 4 shows the structure of FIG. 3 following the introduction of a sacrificial material over the structure and the introduction of a photoresist material patterned to define one or more vias.

FIG. 4 shows the structure of FIG. 3 following the deposition of a sacrificial material (e.g., SLAM, BARC) on the structure and over hard mask 150 and into trench 200. Sacrificial material 210 is deposited to a thickness greater than the depth of trench 200 to provide a planar surface. Following the deposition of sacrificial material 210, photoresist material 220 is deposited and patterned to include opening 230 for via formation. Referring to FIG. 4, it is noted that the patterning of photoresist 220 to define opening 230 does not need to be precise. The presence of hard mask 150 will inhibit etching into dielectric layer 140 in areas protected by the hard mask. In this manner, a self-aligned process for forming vias 250 is described.

Figure 5:
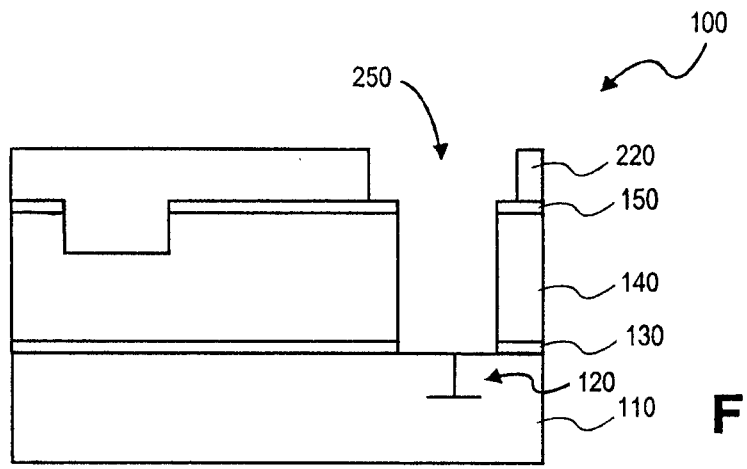
FIG. 5 shows the structure of FIG. 4 following the opening of vias to underlying contact points.

FIG. 5 shows via 250 formed through dielectric layer 140 and etch stop layer 130 to contact points 120.

Figure 6:
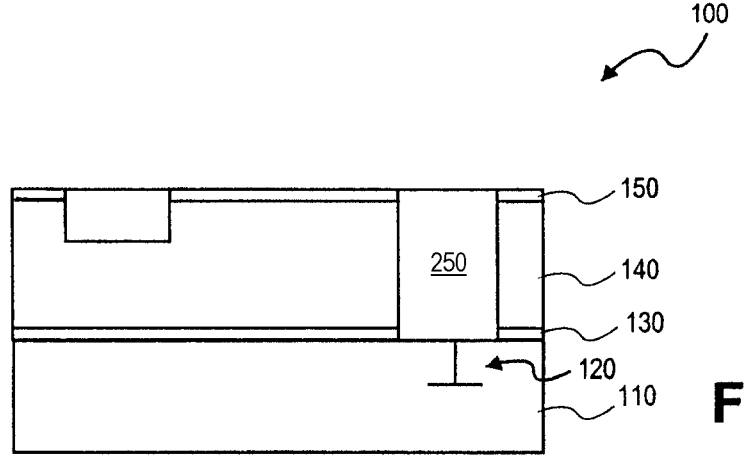
FIG. 6 shows the structure of FIG. 5 following the removal of the sacrificial light absorbing material and the photoresist material and the introduction of a conductive material in the trenches and vias.
Figure 7:
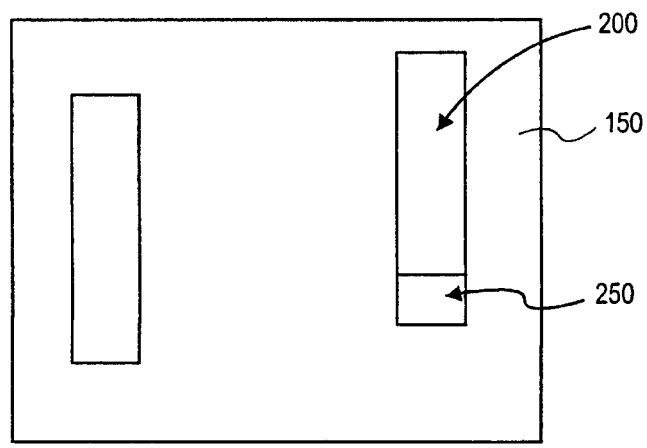
FIG. 7 shows a top view of the structure of FIG. 6.

FIG. 6 shows the structure of FIG. 5 following the removal of photoresist layer 220 and sacrificial material 210 and the deposition of a conductive material such as copper in trench 200 and via 250. A suitable conductive material for trench 200 and via 250 is copper or a copper alloy deposited by an electroplating process. It is appreciated that the via and trench may be lined with a barrier layer or an adhesion layer. Suitable materials for barrier layer include but are not limited to a refractory material such titanium nitride, tungsten nitride, tantalum or tantalum nitride. Suitable materials for an adhesion layer include but are not limited to titanium, tantalum and ruthenium. Further, a suitable seed material may be deposited prior to the introduction of the copper or copper alloy conductive material. Suitable seed materials for a deposition of copper interconnection material include copper, nickel, cobalt and ruthenium. FIG. 6 also shows that hard mask 150 remains after the formation of via 250 and trench 200 and may optionally be retained as a permanent part of structure 110. In another embodiment, hard mask 150 is removed after via 250 is formed. FIG. 7 shows a top view of structure 100 and illustrates trench 200 and via 250 each filled with a conductive material. Adjacent trench 200 and via 250 is a corresponding trench of conductive material. It is appreciated that additional interconnection layers may be formed on the interconnection layer shown in structure 100 to other contact points including, but not limited to, underlying devices, including interconnection lines.

In the above embodiment, full trench depths were formed, followed by removal of the optional hard mask of a conductive material (hard mask 160), and full via depth to a contact point. In another embodiment, this process may be modified by, for example, forming the via to a partial depth prior to removing the optional hard mask of conductive material. In this manner, the remaining dielectric material beyond the partial via depth will protect the contact point (e.g., contact point 120) from possible damage during removal of the optional hard mask of conductive material. Another modification that may be combined with the described partial via depth modification process is a partial trench depth modification where the trench is formed to a partial depth, the via is formed to a partial depth, the optional hard mask of conductive material is removed, and the via and trench depths are completed.

Figure 8:
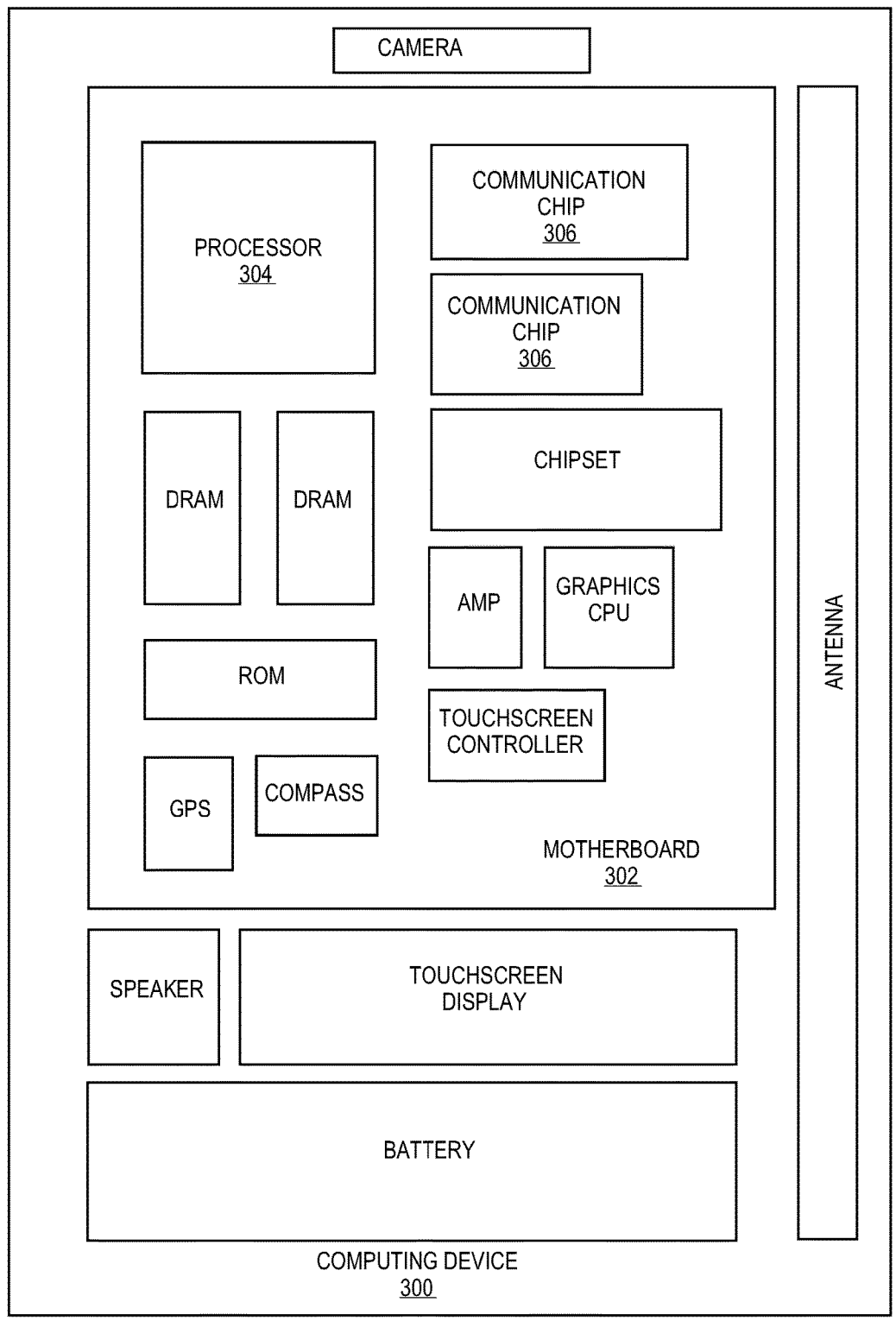
FIG. 8 illustrates a schematic illustration of a computing device.

FIG. 8 illustrates computing device 300 in accordance with one implementation. Computing device 300 houses board 302. Board 302 may include a number of components, including but not limited to a processor 304 and at least one communication chip 306. Processor 304 is physically and electrically connected to board 302. In some implementations the at least one communication chip 306 is also physically and electrically connected to board 302. In further implementations, the communication chip 306 is part of processor 304.

Depending on its applications, computing device 300 may include other components that may or may not be physically and electrically coupled to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 306. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the integrated circuit die of the processor includes one or more devices, such as transistors or interconnectors, that are formed in accordance with implementations described above where one or more dielectric layers (ILD) are covered with a dielectric hard mask that may be retained in the final circuit die structure. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the invention, the integrated circuit die of the communication chip includes one or more devices, such as transistors or interconnectors, that are formed in accordance with implementations described above incorporating a dielectric hard mask on one or more dielectric layers.

In further implementations, another component housed within the computing device 300 may contain an integrated circuit die that includes one or more devices, such as transistors or interconnectors, that are formed in accordance with implementations described above incorporating a dielectric hard mask on one or more dielectric layers.

In various implementations, computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 300 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

The invention claimed is:

1. An integrated circuit apparatus comprising:
   an integrated circuit substrate comprising a contact point of a circuit device layer or an interconnection line;
   a dielectric layer on the contact point, wherein the dielectric layer comprises a trench and a via wherein the trench has a length dimension and a width dimension and wherein the via extends from a base of the trench through the dielectric layer to the contact point and has a width dimension that is the same as the width dimension of the trench;
   a hardmask on the dielectric layer, the hardmask comprising a dielectric material comprising a density greater than a density of a material of the dielectric layer; and
   a conductive material in an opening of the hardmask and in the trench and the via.

2. The apparatus of claim 1, wherein the dielectric layer comprises a material having a dielectric constant less than a dielectric constant of silicon dioxide and the dielectric material of the hardmask has a dielectric constant greater than a dielectric constant of silicon dioxide.

3. The apparatus of claim 2, wherein the dielectric layer comprises a porous material.

4. The apparatus of claim 2, wherein the dielectric material of the hardmask is selected from the group consisting of silicon oxynitride, hafnium oxide, zirconium oxide, hafnium silicate, hafnium oxynitride and lanthanum oxide.

5. The apparatus of claim 1, wherein the contact point comprises an interconnection line.

6. An integrated circuit apparatus comprising:
   an integrated circuit substrate comprising a contact point of a circuit device or an interconnection line;
   an interlayer dielectric material on the contact point, wherein the interlayer dielectric material comprises a trench and a via wherein the trench has a length dimension and a width dimension and wherein the via extends from a base of the trench through the interlayer dielectric material to the contact point and has a width dimension that is the same as the width dimension of the trench;
   a second dielectric material on the interlayer dielectric material, the second dielectric material comprising a dielectric constant great than a dielectric constant of the interlayer dielectric material and the second dielectric material comprises a thickness that will not significantly effect an overall dielectric constant of the combination of the interlayer dielectric material and the second dielectric material; and
   an interconnect material disposed through the second dielectric material and in the trench and the via.

7. The apparatus of claim 6, wherein the interlayer dielectric material comprises a dielectric constant less than a dielectric constant of silicon dioxide and the second dielectric material comprises a dielectric constant greater than a dielectric constant of silicon dioxide.

8. The apparatus of claim 6, wherein the interlayer dielectric layer comprises a porous material.

9. The apparatus of claim 6, wherein the second dielectric material is selected from the group consisting of silicon oxynitride, hafnium oxide, zirconium oxide, hafnium silicate, hafnium oxynitride and lanthanum oxide.

10. The apparatus of claim 6, wherein the contact point comprises an interconnection line.

11. An integrated circuit structure, comprising:
a first interconnection line above a substrate;
an etch stop layer above the first interconnection line;
an interlayer dielectric (ILD) layer on the etch stop layer;
a conductive via in the ILD layer and through a portion of the etch stop layer, the conductive via on a portion of the interconnection line, wherein the conductive via has substantially vertical sidewalls spaced apart by a width along a first horizontal direction; and
a second interconnection line in the ILD layer and on the conductive via, the second interconnection line having substantially vertical sidewalls spaced apart by the width along the first horizontal direction, and the second interconnection line having a length along a second horizontal direction orthogonal to the first horizontal direction, wherein the substantially vertical sidewalls of the second interconnection line are continuous with the substantially vertical sidewalls of the conductive via.

12. The integrated circuit structure of claim 11, further comprising:
a hardmask layer on the second interconnection line, the hardmask layer comprising a high k material.

* * * * *